(12) United States Patent
Sanaka et al.

(10) Patent No.: US 6,579,745 B2
(45) Date of Patent: Jun. 17, 2003

(54) METHOD FOR MOUNTING CHIPS ON BOARD USING MAGNETIC POSITIONING

(75) Inventors: Yumi Sanaka, Kanagawa (JP); Isamu Nakao, Tokyo (JP); Tadashi Ishibashi, Kanagawa (JP); Katsuya Shirai, Kanagawa (JP)

(73) Assignee: Sony Corporation, Tokyo (JP)

( * ) Notice: Subject to any disclaimer, the term of this patent is extended or adjusted under 35 U.S.C. 154(b) by 49 days.

(21) Appl. No.: 09/803,684

(22) Filed: Mar. 9, 2001

(65) Prior Publication Data

US 2002/0013008 A1 Jan. 31, 2002

(30) Foreign Application Priority Data

Mar. 10, 2000 (JP) .......................................... 2000-067345

(51) Int. Cl.$^7$ ............................................... H01L 21/48
(52) U.S. Cl. ........................ 438/108; 438/28; 438/108; 438/3
(58) Field of Search ................................ 438/106, 109, 438/118, 120; 257/14, 81, 85, 88, 89, 90, 100, 200

(56) References Cited

U.S. PATENT DOCUMENTS

| | | | |
|---|---|---|---|
| 4,280,273 A | * | 7/1981 | Vincent .......................... 438/28 |
| 5,102,824 A | * | 4/1992 | Neugebauer et al. ............ 438/28 |
| 5,904,545 A | * | 5/1999 | Smith et al. .................... 438/455 |

* cited by examiner

Primary Examiner—George Fourson
Assistant Examiner—Julio J. Maldonado
(74) Attorney, Agent, or Firm—Sonnenschein, Nath & Rosenthal

(57) ABSTRACT

Disclosed is a method of mounting chips, including the steps of: dipping a mounting board in a solvent in which chips are dispersed; and mounting the chips on the mounting board by forming electric field gradients on the mounting board in correspondence with positions where the chips are to be mounted. With this configuration, fine chips such as fine semiconductor chips can be mounted at desired positions on a mounting board with a high efficiency and a high yield.

5 Claims, 5 Drawing Sheets

F I G. 2
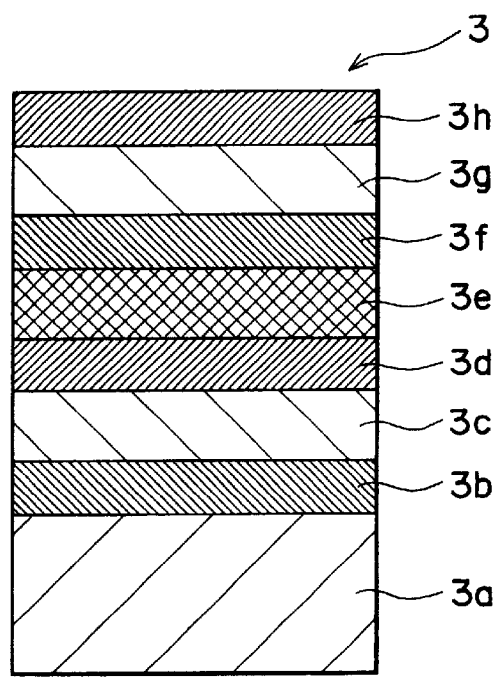
F I G. 3
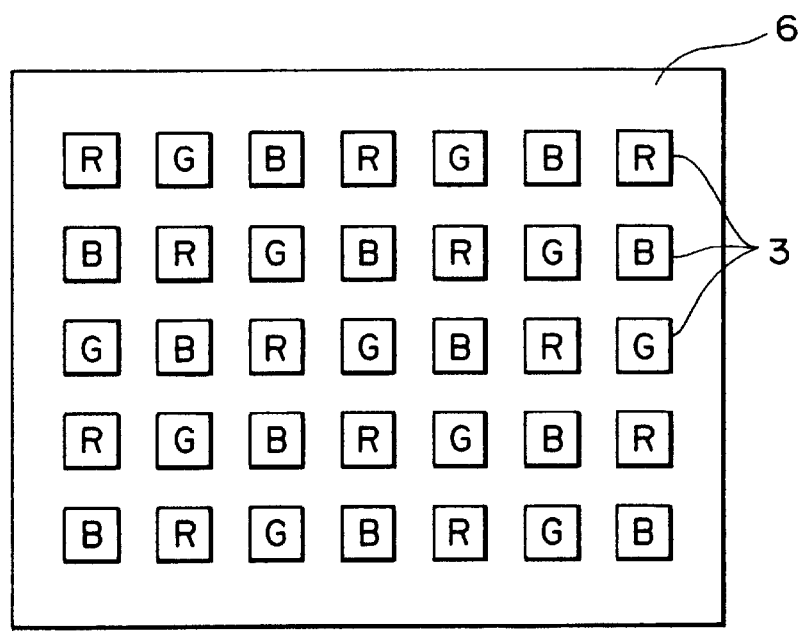

F I G. 6
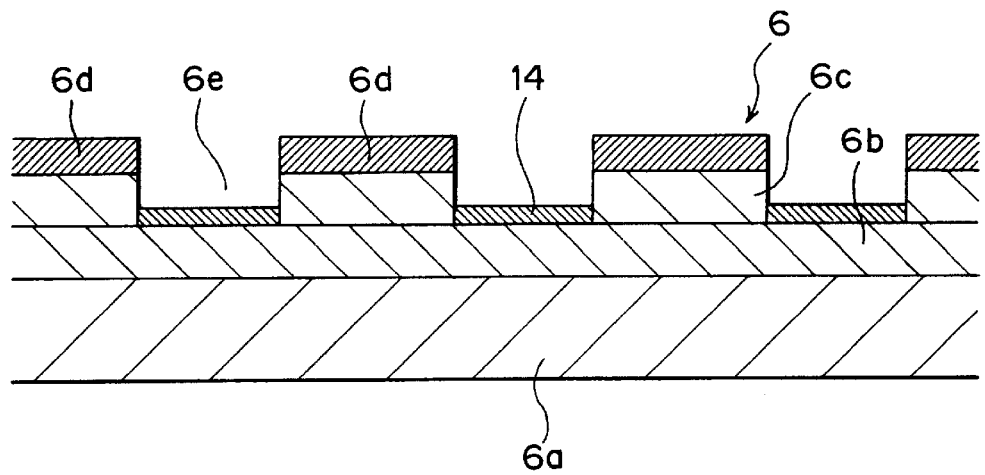
F I G. 7
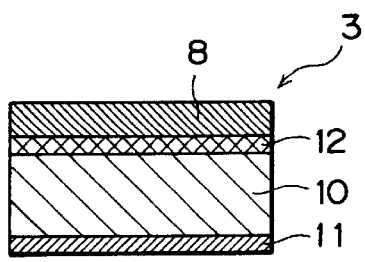
F I G. 8
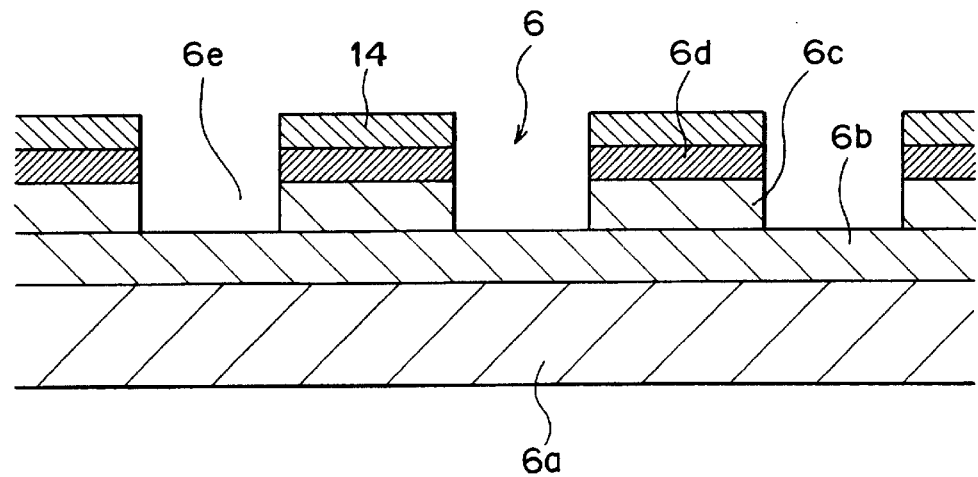

METHOD FOR MOUNTING CHIPS ON BOARD USING MAGNETIC POSITIONING

RELATED APPLICATION DATA

The present application claims priority to Japanese Application No. P2000-067345 filed Mar. 10, 2000, which application is incorporated herein by reference to the extent permitted by law.

BACKGROUND OF THE INVENTION

The present invention relates to a method of mounting chips, and particularly to a method of mounting a large number of fine chips, for example, fine semiconductor chips having sizes of the order of m on boards.

Functional devices formed of semiconductor chips such as LEDs and ICs having fine structures have been mounted on boards by forming the semiconductor chips into shapes such as trapezoidal shapes by etching while providing recesses corresponding thereto on the board side, wherein the semiconductor chips are mounted in the recesses.

The above method, however, has the following problem: namely, in the case of using semiconductor chips made from materials not easy to be formed into trapezoidal shapes by etching or of fine dimensions, the mounting of these semiconductor chips becomes difficult, or the accuracy in shape of the chips and/or the positional accuracy in mounting of the chips are lowered, thereby degrading the mounting yield.

In mounting semiconductor chips such as light emitting devices used for a display on a board, the semiconductor chips have been required to be mounted on a board surface having a specific area with a high efficiency and a high yield, and further, in consideration of the cost. Further, along with the tendency toward miniaturization of semiconductor chips, the handling of the semiconductor chips at the time of mounting have come to be difficult. Accordingly, it has been expected to develop the semiconductor chip structures capable of effectively coping with the above terms, that is, the efficiency, yield, cost, and handling at the time of mounting, and to develop the method of desirably mounting these semiconductor chip structures on boards.

One method of mounting fine chips such as fine semiconductor chips has been disclosed, for example, in U.S. Pat. Nos. 5,545,291, 5,824,186, and 5,904,545, Japanese Patent Laid-open (Translation of PCT International Publication) No. Hei 9-506742, and Japanese Patent Laid-open No. Hei 9-120943. In this mounting method, each chip is tapered to be determined in its vertical direction, and buried in the corresponding recess formed on a board. In this case, the chips are mixed in a solution such as water or alcohol into a slurry, and the slurry is made to flow on the board.

Another method of mounting fine chips, such as IC chips, using static electricity for mounting the IC chips on a board has been described in U.S. patent application Ser. No. 07/902986. In this mounting method, the chips are vibrated by static electricity and are arranged in a state in which the positional energy of the chips is minimized.

According to the former mounting method characterized by tapering semiconductor chips, although a sufficiently large yield can be kept for semiconductor chips whose sizes are in the range of several hundreds $\mu$m or more; however, the yield is lowered for semiconductor chips whose sizes are in the range of several tens $\mu$m or less. Accordingly, this method has a problem from the practical utilization.

The latter mounting method characterized by using static electricity requires an apparatus for vibrating fine chips with static electricity. Further, according to this method, since fine chips collide with each other by mechanical vibration, there may occur an inconvenience that part of each chip be damaged. From this viewpoint, this method is unsuitable to practical use.

SUMMARY OF THE INVENTION

An object of the present invention is to provide a method of mounting chips, typically, fine semiconductor chips, which is capable of mounting the chips at desired positions on a board with a high efficiency and a high yield.

To achieve the above object, according to the present invention, there is provided a method of mounting chips, including the steps of: dipping a mounting board in a solvent in which chips are dispersed; and mounting the chips on the mounting board by forming electric field gradients on the mounting board in correspondence with positions where the chips are to be mounted.

With this configuration, since fine chips such as fine semiconductor chips are mounted on a mounting board not by physical forces based on the shapes of the chips but by electric field gradients, the fine chips can be positively mounted on the mounting board. Further, since fine chips dispersed in a solvent are mounted on a mounting board by forming electric field gradients, a large number of the same kind of the chips can be simultaneously mounted by one process, to thereby increase the process efficiency and enhance the productivity.

The above-described mounting method of the present invention preferably includes the step of applying a surface treatment agent for controlling surface energy on the chips and/or the mounting board in correspondence with positions where the chips are to be mounted.

With this configuration, since the surface energies of a semiconductor chip and a mounting position of the mounting board are made hydrophobic or hydrophilic, it is possible to enhance the absorption ability of the chip to the mounting position, and hence to more positively mount each chip at a desired position on the mounting board.

The above-described mounting method of the present invention preferably the steps of providing a ferromagnetic body or a ferrimagnetic body at a specific position of each of the chips, and specifying the mounting direction of each chip by applying a magnetic field to the ferromagnetic body or the ferrimagnetic body.

With this configuration, since a portion, located at a specific position, of each of fine chips such as fine semiconductor chips is formed of a ferromagnetic body or a ferrimagnetic body, a magnetic field is formed between the above portion of the chip and a mounting board to produce a magnetic flux therebetween, so that the mounting direction of the chip can be controlled by a magnetic attraction force caused by the magnetic flux. As a result, it is possible to positively mount semiconductor chips with their postures arranged in a specific direction, and also to enhance the absorption ability of each chip by the magnetic attraction force and hence to improve the reliability in mounting.

In the above-described mounting method of the present invention, preferably, the solvent is circulated.

With this configuration, since a large number of the chips dispersed in the solvent sequentially come close to the mounting board with a specific probability by circulation and are attracted thereto by the electric field gradients and magnetic forces, it is possible to positively mount a large number of chips on the mounting board with a high efficiency.

The function of the present invention will be described below.

The present invention is intended to provide a method of mounting devices having fine structures on a mounting board and a structure obtained by the mounting method. In particular, the mounting method of the present invention is characterized in that the devices having fine structures are carried via a fluid on the upper surface of a mounting board having portions at which the devices are to be joined or received. The device receiving portion is exemplified by a recess; however, it is not limited thereto. During carrying of the devices having fine structures in the fluid, forces due to an electric field or the like are applied to the devices, with a result that the devices are mounted in the device receiving portions such as recesses in self-alignment. The structure obtained by mounting the devices on the mounting board is represented by a display in which light emitting diodes (LEDs) are mounted on a board having wiring; a signal processor; or a structure in which a semiconductor device is mounted on another semiconductor device or another plastic board. Specific examples of the kinds of devices having fine structures or fine structures (fine chips) may include a laser, a transistor, a gun oscillator, an integrated circuit, a solar connector, or a fine phosphor particle.

According to the present invention, fine chips each having a size of the order of $\mu$m are mounted on a mounting board having chip receiving portions and other regions on the upper surface. The chip receiving portion is exemplified by a recess; however, it is not limited thereto. The mounting board may be made from silicon, gallium-arsenic, glass, a ceramic material, or a plastic material. The mounting board may have one or more chip receiving regions formed by forming wiring on the upper surface thereof as described above. The mounting board may be a plastic sheet.

The mounting process includes a step of preparing chips having fine structures; a step of carrying the fine structures (chips) in a fluid to form a mixture, typically, a slurry; and a step of optimally controlling the flow rate of the slurry and the external forces applied to the chips so that the chips are disposed in a region having at least one chip receiving portion, to mount each chip in the chip receiving portion in self-alignment.

According to the present invention, there is provided an apparatus for mounting fine structures on a mounting board having at least one or more receiving regions and other regions via a fluid. The apparatus may include a power source (voltage supply source) for controlling an electric field for mounting the fine structures, and a magnetic field generator for controlling the mounting directions of the fine structures.

The mounting method and the structure obtained by the mounting method according to the present invention are typically applied to a method of mounting GaAlP based LED chips on a glass board, and the structure obtained by the mounting method. The chip may be formed into any shape which be symmetric or asymmetric, for example, a cylindrical shape, a pyramid shape, a rectangular parallelopiped shape, a cubic shape, a T-shape, a granular shape, and a combined shape thereof. In general, the chip can be tightly inserted in a desired region on the mounting board depending on the shape of the chip. The chip having a fine structure may be formed of one or more layers made from GaAlAs, gallium-arsenic, silicon, diamond, germanium, and a GaN based compound, and further, other III–V compounds and II–VI compounds. The multi-layer structure of the chip can be typically formed by layers of a metal, an insulator such as silicon oxide or silicon nitride, and a combination thereof.

The chips having fine structures are mixed in a solvent to form a slurry-like mixed solution. The mixed solution is circulated by a circulating device in order that the chips are not sunk. A board for assembly (mounting board) on which the chips are to be mounted and an auxiliary electrode plate (counter electrode plate) are dipped in the circulating solution and are connected to a voltage supply source. In addition, depending on the kind of solvent, the chips can be prevented from being sunk due to a difference in specific gravity between the solvent and the chips. In such a case, it is not required to circular the solvent.

The fine chips or particles dispersed in the slurry-like mixed solution can be accurately mounted at desired positions on the mounting board by making use of forces caused by electric field gradients. In this case, electrodes may be formed on the mounting board into a pattern allowing suitable selection of the electrode positions, for example, into a matrix pattern. In this case, by controlling a voltage applied to each electrode position so as to adjust the electric field at the electrode position, each fine chip can be selectively attracted to the electrode position.

The probability in absorption of each chip can be enhanced by positively changing the surface energy of the chip by providing a layer of a surface treatment agent on the chip. In this case, not only the chip side but also the mounting board side may be selectively coated with the surface treatment agent. By combining the effect of providing the layer of the surface treatment agent with the effect of imparting the electric field gradient, it is possible to more positively attract each chip at a desired position.

For chips each having a symmetric shape or no directivity, the mounting directions thereof are not required. On the contrary, chips having an asymmetric shape or a directivity are required to be controlled in mounting directions thereof. In this case, a specific portion of each chip may be formed of a ferromagnetic body or a ferrimagnetic body, and an external magnetic field be applied to the chip or a magnetic field be applied thereto from an electrode formed on the mounting body, to generate a magnetic force, thereby controlling the mounting direction of the chip.

Each of the electrode and the magnetic body may be made from any metal insofar as such a metal does not exert adverse effect on the subsequent steps, for example, it has a property being less corroded with the solvent, not affected by electrolysis, and good in compatibility with the surface treatment agent.

BRIEF DESCRIPTION OF THE DRAWINGS

FIG. 2 is a view showing a configuration of an LED chip to which the present invention is applied;

FIG. 3 is a plan view of a mounting board to which the present invention is applied;

FIG. 6 is a view showing a configuration of a mounting board according to a third embodiment of the present invention;

FIG. 7 is a view showing a configuration of an LED chip to be mounted on the mounting board according to the third embodiment of the present invention;

FIG. 8 is a view showing a configuration of a mounting board according to a fourth embodiment of the present invention;

DETAILED DESCRIPTION OF THE PREFERRED EMBODIMENTS

Hereinafter, preferred embodiments of the present invention will be described with reference to the accompanying drawings.

Figure 1:
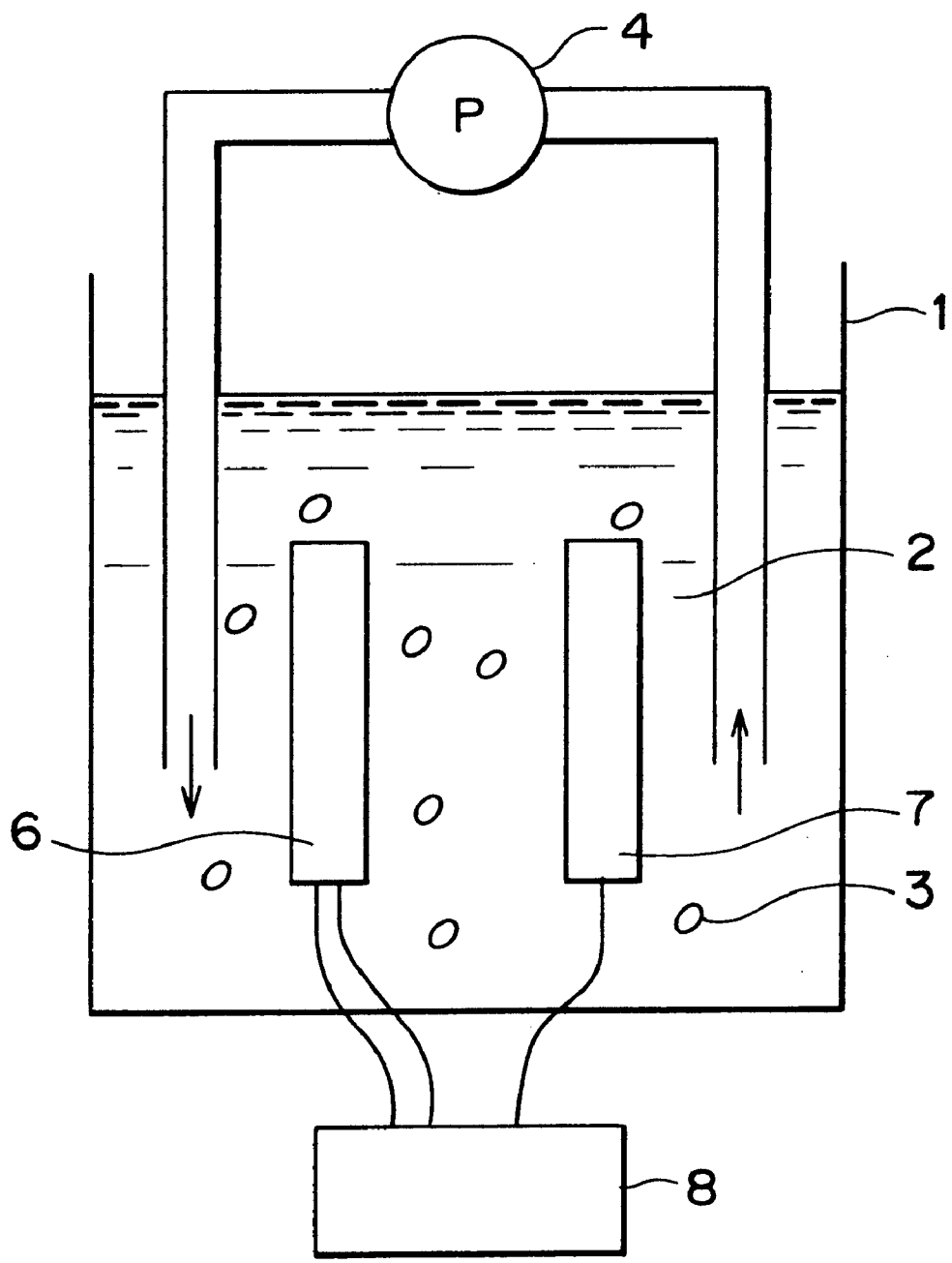
FIG. 1 is a view showing a configuration of an apparatus for carrying out a method of mounting fine chip according to the present invention.

FIG. 1 is a view illustrating a configuration of an apparatus for carrying out a mounting method according to the present invention.

Referring to FIG. 1, a large number of fine LED chips 3 are mixed in a solvent 2 put in a vessel 1, to form a slurry-like solution. The solvent 2 containing the LED chips 3 is circulated by using a pump 4. A mounting board 6 on which the LED chips 3 are to be mounted and a counter electrode plate 7 opposite to the mounting board 6 are dipped in the solvent 2. A large number of electrodes (not shown) corresponding to chip mounting positions are formed on the mounting board 6. Voltages can be selectively applied from a power source 8 to these electrodes. Additionally, electrodes may be formed on the counter electrode plate in order to individually control voltages applied to electrode positions on the counter electrode plate.

[First Embodiment]

Two wiring metal layers (upper electrode layer and lower electrode layer) are formed on a glass board, and GaAlP based LED chips are mounted in stepped recesses between the two layers. This mounting process includes a step of preparing the LED chips, a step of mixing the chips in the solvent to form a slurry, and a step of settling the chips in the recesses formed in the board by making use of, for example, a force caused by an electric field gradient. As a result of carrying out these steps, the chips are mounted at desired positions at a specific filling ratio. In the case of mounting the LED chips on the glass board, the chips are attracted into chip receiving regions (recesses) formed at the specific positions in the upper surface of the glass board, to be mounted in the regions in self-alignment.

FIG. 2 shows a structure of the LED chip 3 shown in FIG. 1.

Referring to this figure, the LED chip 3 is formed by stacking a buffer layer 3b, a first conductive layer 3c, a first carrier confinement layer 3d, a light emitting layer 3e, a second carrier confinement layer 3f, a second conductive layer 3g, and a contact layer 3h on a chip substrate 3a in this order. The chip substrate 3a is made from n-GaAs. The buffer layer 3b is made from n-$Ga_{0.5}In_{0.5}P$ and has a thickness of 30 nm. The first conductive layer 3c, which serves as an etching stopper layer, is made from n-$(Al_{0.7}Ga_{0.3})_{0.5}In_{0.5}P$ and has a thickness of 400 nm. The first carrier confinement layer 3d is made from $(Al_{0.5}Ga_{0.5})_{0.5}In_{0.5}P$ and has a thickness of 30 nm. The light emitting layer 3e is made from 15 QW (Quantum Well) GaInP-AlGaInP. The second carrier confinement layer 3f is made from $(Al_{0.5}Ga_{0.5})_{0.5}In_{0.5}P$ and has a thickness of 30 nm. The second conductive layer 3g is made from p-$(Al_{0.7}Ga_{0.3})_{0.5}In_{0.5}P$ and has a thickness of 400 nm. The contact layer 3h is made from p-$Ga_{0.5}In_{0.5}P$ and has a thickness of 30 nm.

The LED chip 3 is formed into a cubic shape of about 50 μm×50 μm×50 μm, for example. These LED chips are produced by stacking respective layers on a substrate in accordance with a usual LED chip production process and then separated from each other by wet etching or dry etching. The chips thus separated from each other are peeled from the substrate by thinning the thickness of the substrate from the back side up to about 10 μm by means of polishing or wet etching. In addition, after separation of the chips from the substrate, the process is continued in a state in which the chips are stuck on an auxiliary board made from glass or the like until electrodes are formed on the chips and the chips are mixed in a solvent into a slurry.

After formation of p-electrodes and n-electrodes on the chips, it is checked whether or not the chips are acceptable, and thereafter, the chips are dipped in a solvent together with the auxiliary board made from glass or the like. The chips are perfectly separated from the auxiliary board in the solvent and are dispersed in the solvent. The chips are then cleaned by several times, and finally mixed in a solvent used for mounting into a slurry.

FIG. 3 is a plan view of a mounting surface of the mounting board 6 shown in FIG. 1.

The mounting board 6 is a board constituting an LED display screen in which three kinds of LED chips 3 for three primary colors, red (R), green (G), and blue (B) are arranged repeatedly in a specific order to form a matrix pattern. The three kinds of LED chips 3 are mounted on the mounting board 6 by preparing three kinds of slurries, each containing only one of the three kinds (R, G, and B) of LED chips 3, and sequentially mounting the three kinds of LED chips 3 on the mounting board 6 by using the three kinds of slurries. For example, the mounting board 6 is first dipped in the slurry containing the LED chips 3 for R, and the LED chips for R are attracted into R chip mounting regions formed in the mounting board 6 by controlling voltages applied to electric fields in the R chip mounting portions, thereby forming the electric field gradients in the R chip mounting portions, whereby the LED chips for R are mounted in the R chip mounting portions. The mounting board 6 on which the LED chips 3 for R have been mounted is then dipped in the slurry containing the LED chips 3 for G, and the LED chips 3 for G are mounted on the mounting board 6 in the same manner as described above, that is, by forming the electric field gradients by means of voltage control. The mounting board 6 on which the chips 3 for R and G have been mounted is finally dipped in the slurry containing the LED chips 3 for B, and the LED chips 3 for B are mounted on the mounting board 6 in the same manner as described above, that is, by forming the electric field gradients by means of voltage control.

Figure 4:
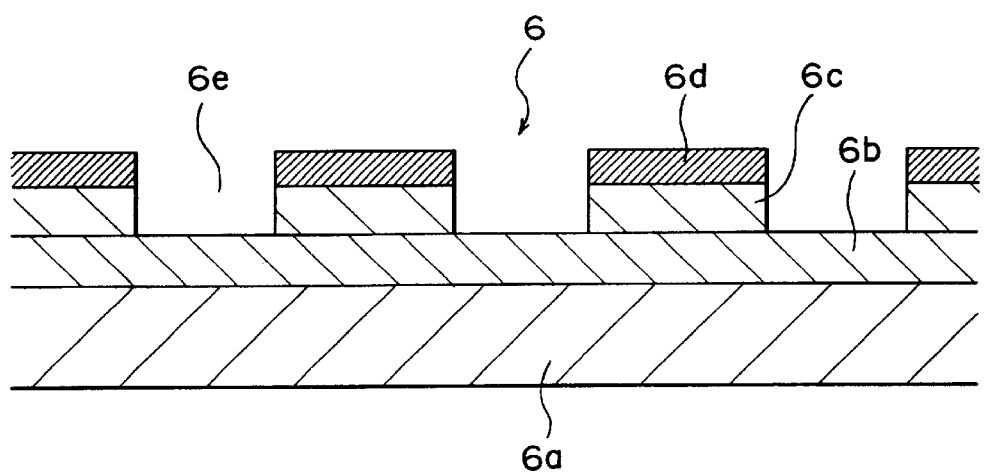
FIG. 4 is a view showing a configuration of a mounting board according to a first embodiment of the present invention.

FIG. 4 is a sectional view of the mounting board 6 according to the first embodiment.

The mounting board 6 is produced by forming a lower electrode layer 6b made from Ti/Au on a glass substrate 6a by vapor-deposition or plating, forming an insulating film 6c made from $SiO_2$ thereon, and forming an upper electrode layer 6d made from Pt by vapor-deposition or plating. The upper electrode layer 6d and the insulating film 6c are patterned, for example, into a matrix and chip receiving portions 6e are formed by stepped portions of the two electrode wiring layer structure. In addition, these electrode layers and insulating film can be formed by a thin film formation process using photolithography.

The counter electrode plate 7 is produced by forming a metal film made from Au on a metal plate or a glass plate having a size nearly equal to that of the mounting board 6 by vapor-deposition or plating.

The mounting board 6 and the counter electrode plate 7 thus produced are oppositely dipped in the slurry-like solvent 2 as shown in FIG. 1. The solvent 2 is circulated together with the LED chips 3 by using a pump 4 in order that the LED chips 3 are not sunk. In such a state, the LED chips 3 are attracted to and held in the chip receiving portions 6e at desired positions by controlling voltages applied to two points of the mounting board 6 and the counter electrode plate 7 by the power source 8.

As one example of the process condition of the first embodiment, a gap between the mounting plate 6 and the counter electrode plate 7 was set to 1 cm and a voltage of 100 V was applied therebetween; and a voltage of 5 V was applied between the upper electrode layer 6d and the lower electrode layer 6b of the mounting board 6, to form an electric field distribution for selection of the chips within the mounting board 6.

[Second Embodiment]

A solder layer made from Sn, In, or Pb—Sn is formed on the surface of the lower electrode layer 6b of the mounting board 6. The solvent 2, the LED chip 3, and the counter electrode plate 7 in this embodiment are the same as those in the first embodiment.

Figure 5:
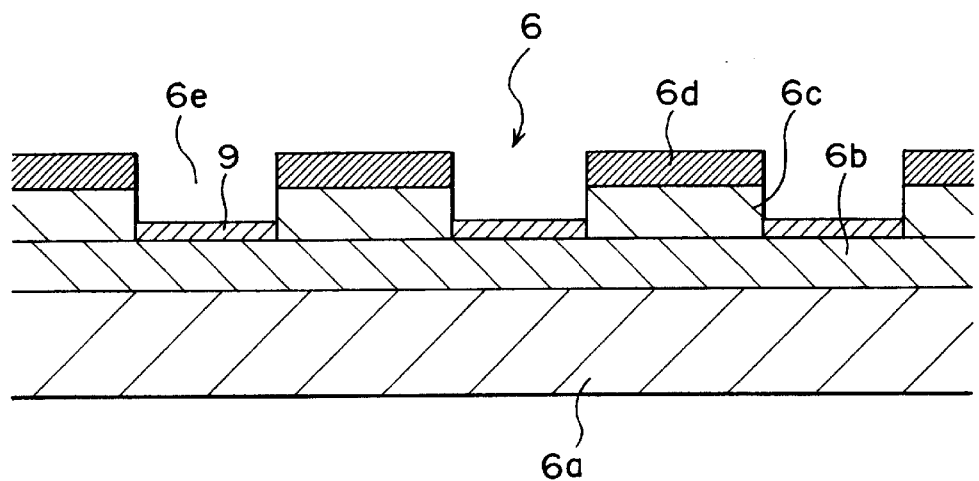
FIG. 5 is a view showing a configuration of a mounting board according to a second embodiment of the present invention.

FIG. 5 is a sectional view of the mounting board 6 according to the second embodiment. As shown in this figure, a solder layer 9 is formed on the lower electrode layer 6b in the chip receiving portions 6e.

According to the second embodiment, the process is carried out by mounting the LED chips 3 on the mounting board 6 with attraction forces caused by electric field gradients like the first embodiment, taking the mounting board 6 out of the solvent and drying the mounting board 6, and melting the solder by heating the mounting board 6, to fix the LED chips 3 in the chip receiving portions 6e formed in the mounting board 6.

[Third Embodiment]

Each LED chip 3 and/or the mounting board 6 are coated with a surface treatment agent for adjusting a surface energy. The other configurations of this embodiment are the same as those of the first embodiment.

FIGS. 6 and 7 show cross-sectional structures of the mounting board 6 and the LED chip 3 according to the third embodiment, respectively.

As shown in FIG. 6, the lower electrode layer 6b in the chip receiving portions 6e of the mounting board 6 is coated with a surface treatment agent 14. As the surface treatment agent 14, there is used a solution prepared by dissolving 1-octane thiol in cyclohexane at a concentration of 0.1 mMol/L. The mounting board 6 is dipped in the solution for 1 hr, being taken out of the solution, and is cleaned with cyclohexane. With this treatment, a single molecular film of 1-octane thiol is formed as the surface-treatment agent 14 on the lower electrode layer (Ti/Au) 6b of the mounting board 6. In this way, there can be obtained the mounting board 6 in which only the lower electrode layer 6b has a high surface energy, that is, a low hydrophobic property.

As shown in FIG. 7, the LED chip 3 according to the third embodiment includes an LED structure portion 10, an n-electrode 11 formed on one surface of the LED structure portion 10, a p-electrode 12 formed on the other surface of the LED structure portion 10, and a layer of the surface treatment agent 14 provided on one surface (on the p-electrode side in this embodiment) of the LED chip 3.

As the surface treatment agent 14, there is used a solution prepared by dissolving 1-octane thiol in cyclohexane at a concentration of 0.1 mMol/L. The LED chip 3 is dipped in the solution for 1 hr, being taken out of the solution, and is cleaned with cyclohexane. With this treatment, a single molecular film of 1-octane thiol is formed as the surface treatment agent 14 on the chip electrode. In this way, there can be obtained the LED chip 3 in which only the electrode surface has a high surface energy, that is, a low hydrophobic property.

The LED chips 3, in each of which the layer of the surface treatment agent 14 is provided on one surface thereof, are dispersed in the solvent 2 used for mounting of the chips.

By surface-treatment of the LED chip 3 and the mounting board 6 with the surface treatment agent 14, the surface energies of specific portions can be made hydrophobic or hydrophilic. In the case of mounting the LED chips 3 whose surfaces have been treated on the mounting board 6 whose surface has been treated in self-alignment by making use of electric field gradients like the first embodiment, the hydrophobic or hydrophilic surface of each LED chip 3 is attracted to the corresponding hydrophobic or hydrophilic chip receiving portion of the mounting board 6. As a result, it is possible to more accurately control the mounting positions of the LED chips 3 and increase the chip attracting/holding forces, and hence to improve the reliability in mounting.

[Fourth Embodiment]

In this embodiment, as shown in FIG. 8, a layer of the surface treatment agent 14 is formed on the upper electrode layer 6d of the mounting board 6. The basic structure of the mounting board 6 in this embodiment is the same as that of the mounting board 6 in the first embodiment shown in FIG. 4; however, in the mounting board 6 in the fourth embodiment, the lower electrode layer 6b is made from Ti/Pt; the insulating film 6c is made from $SiO_2$; and the upper electrode layer 6d is made from Au.

As the surface treatment agent 14, there is used a solution prepared by dissolving 1-octane thiol in cyclohexane at a concentration of 0.1 mMol/L. The mounting board 6 is dipped in the solution for 1 hr, being taken out of the solution, and is cleaned with cyclohexane. With this treatment, a single molecular film of 1-octane thiol is formed as the surface treatment agent 14 on the upper electrode layer 6d made from Au of the mounting board 6. In this way, there can be obtained the mounting board 6 in which only the upper electrode layer has a high surface energy, that is, a low hydrophobic property.

In this embodiment, the LED chips 3 are mounted in self-alignment in the chip receiving portions 6e not coated with the surface treatment agent 14. The LED chips 3 may be subjected or not subjected to surface treatment by using the surface treatment agent 14 as shown in FIG. 7. The kind of the surface treatment agent 14 may be selected so that the combination of the surface energies (for example, the combination of the hydrophobic properties, the combination of the hydrophilic properties, or the combination of the hydrophobic property and the hydrophilic property) of the lower electrode layer 6b in the chip receiving portions 6e and the LED chip 3 allows the LED chips 3 to be easily attracted in the chip receiving portions 6e.

In the case of mounting the LED chips 3 on the mounting board 6 whose surface has been treated by using the surface treatment agent 14 in self-alignment by making use of electric field gradients like the first embodiment, it is possible to obtain an effect similar to that obtained in the third embodiment, that is, to more accurately control the mounting positions of the LED chips 3 and increase the chip attracting/holding forces, and hence to improve the reliability in mounting.

[Fifth Embodiment]

In this embodiment, it is intended to control the mounting directions of fine chips by making use of a magnetic field.

Figure 9:
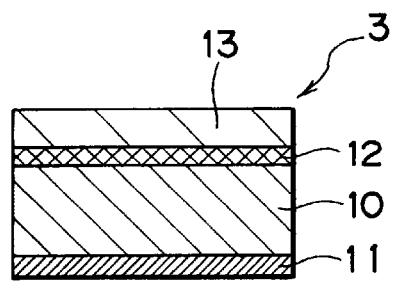
FIG. 9 is a view showing a configuration of an LED chip according to a fifth embodiment of the present invention.

As shown in FIG. 9, the LED chip 3 in this embodiment includes an LED structure portion 10, an n-electrode 11 formed on one surface of the LED structure portion 10, a p-electrode 12 formed on the other surface of the LED structure portion 10, and a layer of a magnetic body 13 provided on one surface (on the p-electrode side in this embodiment) of the LED chip 3.

The layer of the magnetic body 13 is formed in the following procedure.

In a state before peeling of the LED chips from a chip substrate, that is, in a state in which the device structure portions of the LED chips are fixed on the chip substrate, a ferromagnetic body or a ferrimagnetic body made from iron or permalloy having a Curie temperature or an Neel temperature more than room temperature is formed on the front surfaces of the chips (that is, on the back surface side of the substrate) by printing, sputtering, or vapor-deposition. The chips are then separated from each other or separated from each other together with the chip substrate. In this way, the LED chips, each including the layer of the magnetic body 13 having a thickness of about 1 $\mu$m and also having a mass magnetization of about 200 G·cm$^3$/g, are obtained. The magnetic body 13 is magnetized in the in-plane direction of the substrate due to the shape magnetic anisotropy.

Alternatively, the layer of the magnetic body can be formed in the following procedure. LED devices, each having a transparent electrode on the front surface, are formed on an auxiliary substrate in alignment with each other, and recesses, which become magnetic body forming regions, are formed on the back surface side of the substrate by patterning using photolithography. Then, a ferromagnetic body or a ferrimagnetic body made from iron or permalloy is formed overall on the back surface of the substrate including the recesses by vapor-deposition, and the inner surfaces of the recesses are coated with a ferromagnetic body resin or a ferrimagnetic body resin in which iron particles or the like are dispersed while being oriented in a specific direction and which has a high coercive force. The two magnetic body layers are thus formed in the recesses. The LED chips are separated from each other by cleavage. In this way, the LED chips, each having the two magnetic body layers different from each other in coercive force, are obtained. By forming the two magnetic body layers on each chip, it is possible to specify the directions of magnetic fluxes from the magnetic body having a higher coercive force and thereby suppress the leakage of the magnetic fluxes to the outside, and hence to prevent the chips from being overlapped.

The LED chips 3 thus produced are mounted in self-alignment at desired positions on the mounting board 6 in accordance with the same manner as that described above using the apparatus described in FIG. 1, that is, by circulating the slurry containing the LED chips 3 by means of the pump 4 and controlling the electric field gradients. In this embodiment, the gap between the mounting board 6 and the counter electrode plate 7 is set to 1 cm and a voltage applied therebetween is set to 100 V. Further, a voltage of 5 V is applied between the upper and lower electrode layers of the mounting board 6, to form an electric field distribution for selection of the chips within the mounting board 6. At the same time, a uniform magnetic field of about 1 kOe is applied in the direction perpendicular to the electric field by a Helmholtz coil, to thereby control each chip so that the substrate surface of the chip is usually directed to the electric field applied thereto.

In addition, each electrode of the mounting board 6 may be made from a ferromagnetic material. In this case, the mounting direction of each chip can be specified by a magnetic attraction force caused between the magnetic body of the chip and the electrode of the mounting board 6 without applying no external magnetic field.

[Sixth Embodiment]

Figure 10:
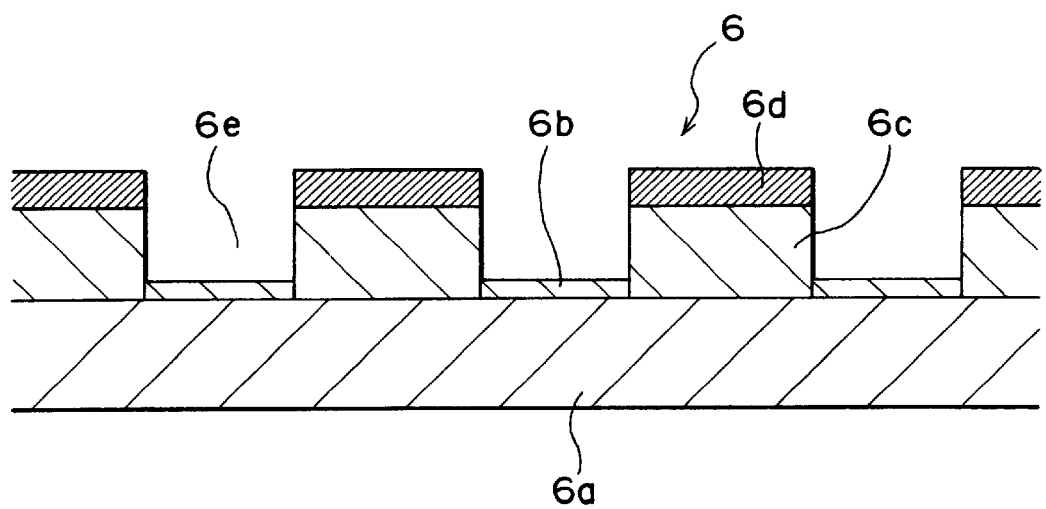
FIG. 10 is a view showing a configuration of a mounting board according to a sixth embodiment of the present invention.

This embodiment has the same basic structure as that of the first embodiment except that as shown in FIG. 10, the lower electrode layer 6b is not continuously formed on the glass substrate 6a, but is discontinuously, that is, independently formed on the glass substrate 6a in such a manner as to be buried in the chip receiving portions 6e formed in the upper electrode layer 6d. With this configuration, the positional selection of the chip receiving portion 6e can be easily performed. In this embodiment, the lower electrode layer 6b on the glass substrate 6a is made from Ti/Au; the intermediate insulating film 6c is made from SiO$_2$; and the upper electrode layer 6d is made from Pt. Each electrode layer is formed by vapor-deposition or plating.

The LED chips 3 are mounted in self-alignment in the chip receiving portions 6e located at desired positions on the mounting board 6 having the above configuration in accordance with the same manner as that described above using the apparatus shown in FIG. 1, that is, by circulating the slurry containing the LED chips 3 by means of the pump 4 and controlling the electric field gradients. As one example of the mounting process condition, the gap between the mounting board 6 and the counter electrode plate 7 is set to 1 cm and a voltage applied therebetween is set to 100 V. Further, within the mounting board 6, a voltage of 7 V is applied to the electrode at a portion in which the LED chip 3 is to be mounted while a voltage of 0 V is applied to the other portion, to thereby control the mounting position of the chip. In this case, the positional control of each chip can be positively performed irrespective of the fact that the mounting position is symmetric (the other electrodes are disposed on both sides of the mounting position) or the mounting position is asymmetric (the other electrode is disposed on one side of the mounting position, for example, at the end portion of the board).

As described above, according to the present invention, since fine chips such as fine semiconductor chips are mounted on a mounting board not by physical forces based on the shapes of the chips but by electric field gradients, the fine chips can be positively mounted on the mounting board. To be more specific, according to the mounting method of the present invention, fine chips each having a size of the order of $\mu$m can be mounted on a mounting board at a mounting yield being as high as about 100%. Since fine chips dispersed in a solvent are mounted on a mounting board by forming electric field gradients, a large number of the same kind of the chips can be simultaneously mounted by one process, to thereby increase the process efficiency and enhance the productivity. Additionally, since a mounting board is not required to have any positioning taper, it is possible to simplify the process of producing mounting boards, and hence to reduce the cost.

While the preferred embodiments of the present invention have been described using the specific terms, such description is for illustrative purposes only, and it is to be understood that changes and variations may be made without departing from the spirit or scope of the following claims.

What is claimed is:

1. A method of mounting chips, comprising the steps of:
   dipping a mounting board in a solvent in which chips are dispersed;
   mounting the chips on the mounting board by forming electric field gradients on the mounting board in correspondence with positions where the chips are to be mounted; and providing a magnetic body at a specific position of each of the chips, and specifying the mounting direction of each chip by applying a magnetic field to the magnetic body.

2. A method of mounting chips according to claim 1, further comprising the step of applying a surface treatment agent for controlling surface energy on the chips and/or the mounting board in correspondence with positions where the chips are to be mounted.

3. A method of mounting chips according to claim 1, wherein the solvent is circulated.

4. The method of claim 1, wherein the magnetic body is a ferromagnetic body.

5. The method of claim 1, wherein the magnetic body is a ferrimagnetic body.

* * * * *